United States Patent
Maki et al.

(10) Patent No.: US 8,561,664 B2
(45) Date of Patent: Oct. 22, 2013

(54) DIE BONDER, PICKUP METHOD, AND PICKUP DEVICE

(75) Inventors: Hiroshi Maki, Kumagaya (JP); Naoki Okamoto, Kumagaya (JP)

(73) Assignee: Hitachi High-Tech Instruments Co., Ltd., Saitama (JP)

( * ) Notice: Subject to any disclaimer, the term of this patent is extended or adjusted under 35 U.S.C. 154(b) by 268 days.

(21) Appl. No.: 12/880,383

(22) Filed: Sep. 13, 2010

(65) Prior Publication Data

US 2011/0308738 A1 Dec. 22, 2011

(30) Foreign Application Priority Data

Jun. 17, 2010 (JP) ................... 2010-138794

(51) Int. Cl.
 *B32B 38/10* (2006.01)
 *H01L 21/00* (2006.01)

(52) U.S. Cl.
 USPC ........... 156/758; 156/707; 156/716; 156/765; 156/932; 156/943; 438/464; 438/976

(58) Field of Classification Search
 USPC ......... 156/716, 765, 931, 932, 941, 943, 707, 156/758; 438/464, 976
 See application file for complete search history.

(56) References Cited

U.S. PATENT DOCUMENTS

| 4,556,362 A | * | 12/1985 | Bahnck et al. | ............ 414/744.3 |
| 7,498,241 B2 | * | 3/2009 | Maki et al. | .................... 438/464 |
| 2008/0086874 A1 | * | 4/2008 | Cheung et al. | .................. 29/762 |

FOREIGN PATENT DOCUMENTS

| JP | 10-189690 | 7/1998 |
| JP | 11-297793 | 10/1999 |
| JP | 2002-184836 | 6/2002 |
| JP | 2007-042996 | 2/2007 |
| JP | 2007-158103 | 6/2007 |

\* cited by examiner

*Primary Examiner* — Mark A Osele

(74) *Attorney, Agent, or Firm* — Antonelli, Terry, Stout & Kraus, LLP.

(57) ABSTRACT

An object of the present invention is to provide a pickup device that can securely peel a die or to provide a reliable die bonder or a pickup method using the pickup device. To achieve the object, the present invention is provided with a characteristic that when a die to be peeled out of plural dies (semiconductor chips) applied to a dicing film is thrust up and is peeled from the dicing film, the dicing film in a predetermined part in a circumference of the die is thrust up and a peeling starting point is formed, the dicing film in a part except the predetermined part is thrust up, and the die is peeled from the dicing film.

10 Claims, 13 Drawing Sheets

DIE BONDER, PICKUP METHOD, AND PICKUP DEVICE

FIELD OF THE INVENTION

The present invention relates to a die bonder, a pickup method and a pickup device, and particularly relates to a reliable die bonder, a pickup method and a pickup device that can securely peel a die.

BACKGROUND OF THE INVENTION

A part of a process for mounting a die (a semiconductor chip) (hereinafter merely called die) on a board such as a wiring board and a lead frame and assembling a package includes a process for dividing a semiconductor wafer (hereinafter merely called wafer) into dies and a die bonding process for mounting the divided dies on the board.

The bonding process includes a peeling process for peeling the dies divided from the wafer. In the peeling process, these dies are peeled one by one from a dicing tape held on a pickup device and are fed onto the board using an adsorption jig called a collet.

In the related art for executing the peeling process, techniques disclosed in JP-A-2002-184836 and JP-A-2007-42996 for example are described. JP-A-2002-184836 discloses technique for peeling by installing a first group of thrusting pins provided at four corners of a die and a second group of thrusting pins each end of which is lower than that of the first thrusting pin and which are provided to the center or a circumference of the die in a pin holder and raising the pin holder.

Further, JP-A-2007-42996 discloses technique for sequentially thrusting up three blocks by providing the three blocks the thrust height of which can be raised toward the center of a die and providing a projection integrated with each of four corners of the outermost outside block and protruded in a direction of a corner of the die.

Recently, to promote the high density packaging of semiconductor devices, the thinning of a package is in progress. Particularly, a stacked die package in which plural dies are three-dimensionally mounted on a wiring board of a memory card is realized. When such a stacked die package is assembled, the thickness of the die is demanded to be 20 μm or less so as to prevent an increase of the thickness of the package.

When the die is thinned, the rigidity of the die is extremely reduced, compared with the adhesive strength of a dicing tape. Therefore, in the method using the two-stage first and second thrusting pins different in height disclosed in JP-A-2002-184836 or in the method using the multi-stage blocks provided with the projections disclosed in JP-A-2007-42996, the die is also peeled at a stretch from its periphery or its corner. When the die is peeled at a stroke, an effect of anchoring that obstructs peeling, that is, stress concentrates at the periphery or the corner of the die and when the die is thinned to the above-mentioned thickness, the periphery or the corner of the die is deformed and the die is broken. Particularly, when a die attach film exists between the die and the dicing tape, adhesive strength between the dicing tape and the die attach film may be stronger than that between the die and the dicing tape due to the effect of anchoring increased by dicing the die attach film. Further, stability is not acquired and the peeling of the die becomes difficult.

SUMMARY OF THE INVENTION

The present invention is made in view of the above-mentioned problem and a first object of the present invention is to provide a pickup method and a pickup device in which a die can be securely peeled.

Further, a second object of the present invention is to provide a reliable die bonder using the pickup device that attains the first object.

To achieve the above-mentioned objects, the present invention has a first characteristic that when a die to be peeled out of plural dies applied to a dicing film is thrust up and is peeled from the dicing film, the dicing film in a predetermined part in a circumference of the die is thrust up and a peeling starting point is formed, then the dicing film in a part except the predetermined part is thrust up and the die is peeled from the dicing film.

Further, the present invention has a second characteristic that the peeling starting point is formed by a pin, in addition to the first characteristic to achieve the objects.

Further, the present invention has a third characteristic that the predetermined part is provided in at least one of four corners of the die, in addition to the second characteristic to achieve the objects.

Furthermore, the present invention has a fourth characteristic that two thrusting operations are driven by an effector vertically driven by a single driving source, when the effector is raised, one of the two thrusting operations is executed and when the effector is lowered, the other thrust is executed via an inverting part that converts the lowering to rise, in addition to the second characteristic to achieve the objects.

Furthermore, the present invention has a fifth characteristic that one of the two thrust is the thrust for forming the peeling starting point, in addition to the fourth characteristic to achieve the objects.

According to the present invention, the pickup method and the pickup device in which the die can be securely peeled can be provided.

In addition, according to the present invention, the reliable die bonder can be provided using the pickup method or the pickup device.

DETAILED DESCRIPTION OF THE PREFERRED EMBODIMENTS

Figure 1:
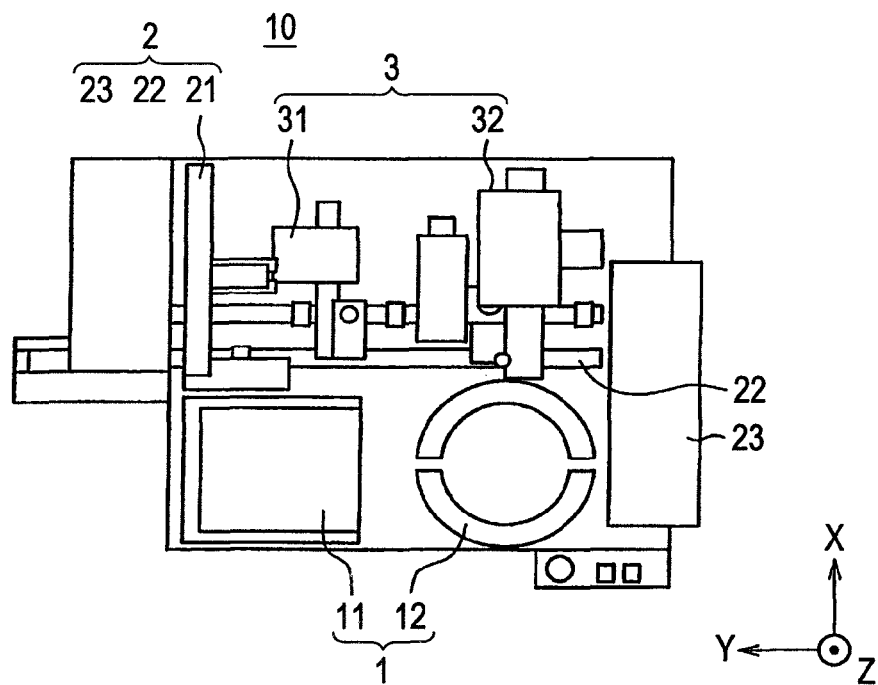
FIG. 1 is a schematic top view showing a die bonder equivalent to one embodiment of the present invention.

Referring to the drawings, embodiments of the present invention will be described below.

FIG. 1 is a conceptual top view showing a die bonder 10 equivalent to one embodiment of the present invention. The die bonder is roughly provided with a wafer supply unit 1, a workpiece supplying/feeding unit 2 and a die bonding unit 3.

The workpiece supplying/feeding unit 2 is provided with a stack loader 21, a frame feeder 22 and an unloader 23. A workpiece (a lead frame) supplied to the frame feeder 22 by the stack loader 21 is fed to the unloader 23 through two processing positions on the frame feeder 22.

The die bonding unit 3 is provided with a preformer 31 and a bonding head device 32. The preformer 31 applies a die adhesive to the workpiece fed by the frame feeder 22. The bonding head device 32 picks up a die from a pickup device 12, lifts it and moves it to a bonding point on the frame feeder 22 in horizontally. The bonding head device 32 lowers the die and bonds it on the workpiece to which the die adhesive is applied.

The wafer supply unit 1 is provided with a wafer cassette lifter 11 and the pickup device 12. The wafer cassette lifter 11 is provided with a wafer cassette (not shown) filled with wafer rings and the wafer ring is sequentially supplied to the pickup device 12.

Figure 2:
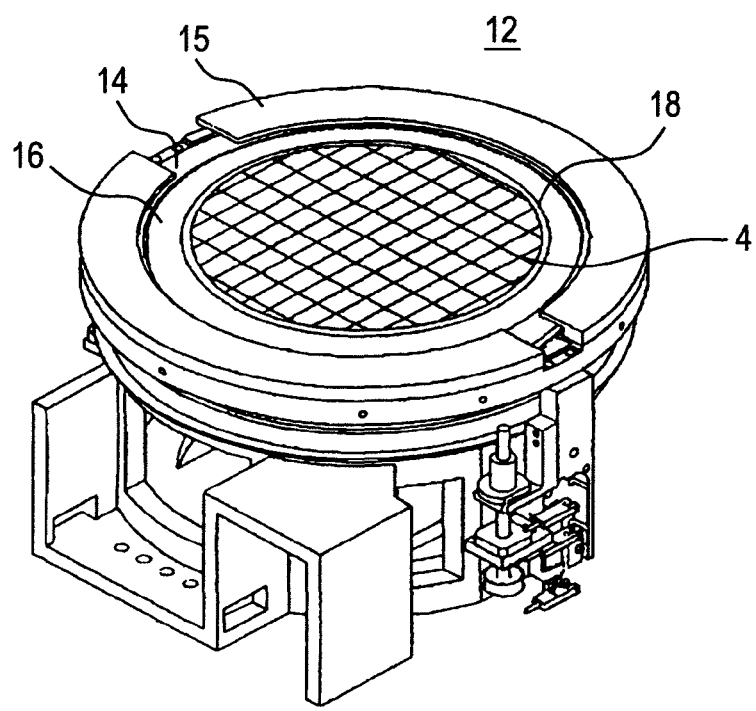
FIG. 2 is a perspective view showing the appearance of a pickup device equivalent to one embodiment of the present invention.
Figure 3:
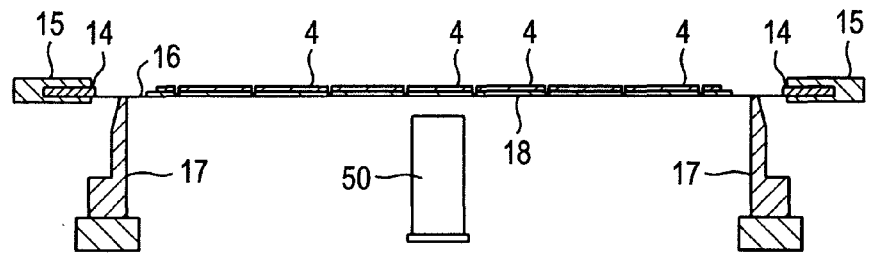
FIG. 3 is a schematic sectional view showing a main part of the pickup device equivalent to one embodiment of the present invention.

Next, referring to FIGS. 2 and 3, the configuration of the pickup device 12 will be described. FIG. 2 is a perspective view showing the appearance of the pickup device 12. FIG. 3 is a schematic sectional view showing a main part of the pickup device 12. As shown in FIGS. 2 and 3, the pickup device 12 is provided with an expansion ring 15 that holds the wafer ring 14, a support ring 17 that horizontally positions a dicing tape 16 which is held by the wafer ring 14 and to which plural dies (chips) 4 are bonded and a thrusting unit 50 arranged inside the support ring 17 for thrusting the die 4. The thrusting unit 50 is vertically moved by a driving mechanism not shown and is horizontally moved by the pickup device 12.

The pickup device 12 lowers the expansion ring 15 that holds the wafer ring 14 when the die 4 is thrust up. As a result, the dicing tape 16 held by the wafer ring 14 is drawn out, an interval between the dies 4 is widened, the die 4 is thrust up from the downside of the die by the thrusting unit 50, and the performance of picking up the die 4 is enhanced. The adhesive is turned from liquid to a film following to die thinning and filmy adhesive material called a die attach film 18 is applied between a wafer and the dicing tape 16. As for the wafer provided with the die attach film 18, dicing is applied to the wafer and the die attach film 18. Accordingly, in a peeling process, the wafer and the die attach film 18 are peeled from the dicing tape 16.

Figure 4A:
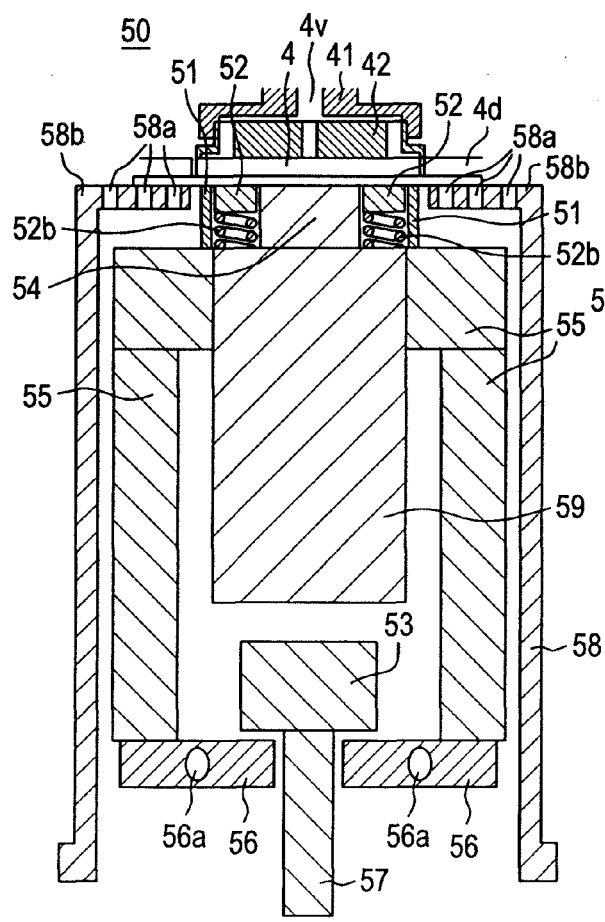
FIG. 4A shows the configuration of a thrusting unit equivalent to a first embodiment of the present invention and the configuration of a collet attachment in a bond head unit and FIG. 4B is, respectively of the thrusting unit, a top view showing a thrusting block and a part in which a peeling starting point forming pin exists.
Figure 4B:
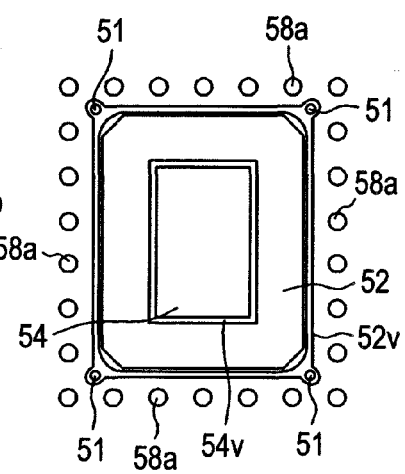

FIG. 4A shows the configuration of the thrusting unit 50 and the configuration of a collet attachment 40 in the bond head unit (not shown) in a first embodiment of the present invention. FIG. 4B is a top view showing a thrusting block described later of the thrusting unit and a part in which a peeling starting point forming pin exists.

Figure 6A:
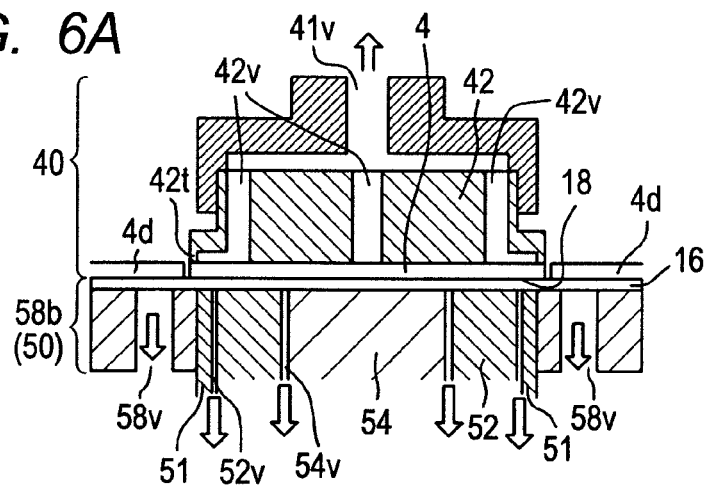
FIGS. 6A to 6D show the operation of the vicinity of a dome head and the collet attachment in the processing flow shown in FIG. 5.

As shown in FIGS. 4A and 6A, the collet attachment 40 includes a collet 42, a collet holder 41 that holds the collet 42 and suction holes 41v, 42v provided to the respective components for suctioning the die 4.

On the other hand, the thrusting unit 50 is roughly provided with the thrusting block, the part in which the peeling starting point forming pin exists, a driving part that drives the thrusting block and the part in which the peeling starting point forming pin exists and a dome body 58 that holds them. The thrusting block is provided with a block body 59, an inside block 54 directly connected to the block body 59 and an outside block 52 provided to a circumference of the inside block via a half transfer spring 52b and having a smaller outline than an outline of the die 4.

The part in which the peeling starting point forming pin exists is provided with the four peeling starting point forming pins 51 provided outside four corners of the outside block 52, that is, at the four corners of the die 4, pin raising/lowering links 55 that hold the peeling starting point forming pins and are vertically movable and pin driving links 56 that are rotated using each point 56a for a fulcrum and raise and lower the pin raising/lowering links 55, as shown in FIG. 4B.

The driving part is provided with a driving shaft 57 vertically moved by a motor and an effector 53 vertically moved according to a vertical motion of the driving shaft 57. When the effector 53 is lowered, the right and left pin driving links 56 are rotated, the pin raising/lowering links 55 are raised and the pin raising/lowering links thrust the peeling starting point forming pins 51. When the effector 53 is raised, the block body is raised and the outside and inside blocks are thrust up. The pin raising/lowering link 55 and the pin driving link 56 configure an inverting part for converting a lowering motion of the effector 53 to a motion (a rising motion) for thrusting the peeling starting point forming pin 51 according to the above-mentioned description.

In an upper part of the dome body 58, a dome head 58b equipped with many adsorption holes 58a that suction and hold the die 4 is provided. In FIG. 4B, although only one row is shown around the block, plural rows are provided to stably hold the die 4d which is not a target of pickup. As shown in FIG. 4B, clearance 54v between the inside block 54 and the outside block 52 and clearance 52v between the outside block 52 and the dome head 58b are sucked so as to hold the dicing tape 16 on the side of the block.

Figure 5:
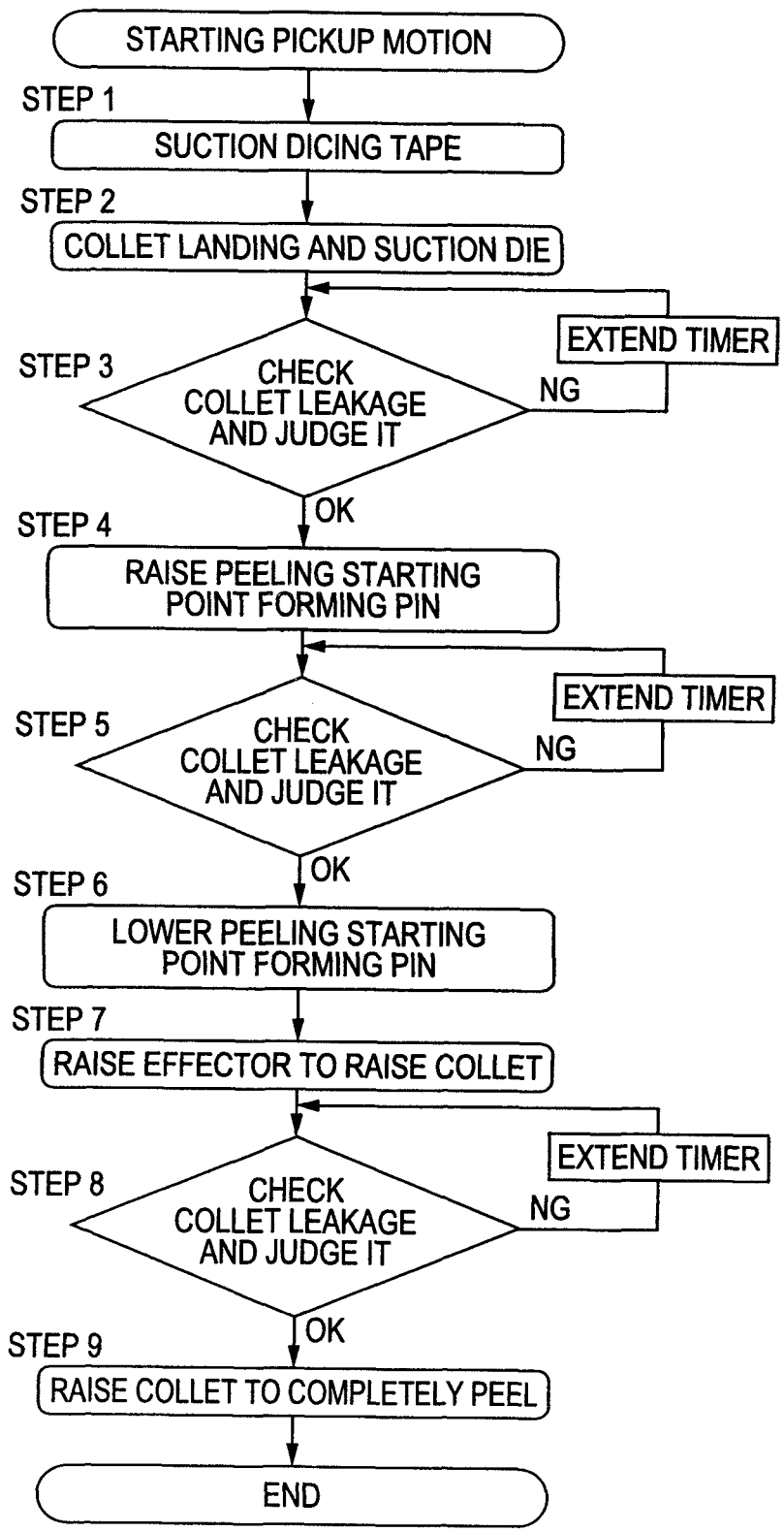
FIG. 5 shows a processing flow of pickup operation in the embodiment of the present invention.

Next, pickup operation by the thrusting unit 50 having the above-mentioned configuration will be described referring to FIGS. 5 to 7D. FIG. 5 shows a processing flow showing the pickup operation. FIGS. 6A to 6D show the vicinity of the dome head 58b and the operation of the collet attachment 40 in the processing flow shown in FIG. 5. FIGS. 7A to 7D mainly show the driving operation of the thrusting unit 50 when the die 4 is picked up in the processing flow shown in FIG. 5. Respective corresponding drawings of FIGS. 6A to 6D and FIGS. 7A to 7D show the operation at the same time.

Figure 7A:
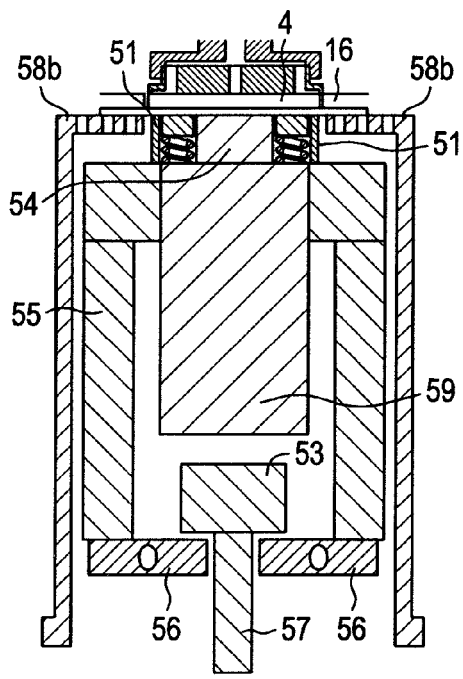
FIGS. 7A to 7D mainly show the driving operation of the thrusting unit in the pickup operation of a die in the processing flow shown in FIG. 5.

First, the peeling starting point forming pin 51, the outside block 52 and the inside block 54 are placed at the same level as the surface of the dome head 58b as shown in FIG. 6A and the dicing tape 16 is suctioned by the adsorption hole 58a of the dome head 58b and the clearances 52v, 54v between the blocks (a step 1). Next, the collet attachment 40 is lowered, is positioned on the die 4 to be picked up, and suctions the die 4 by the suction holes 41v, 42v (a step 2). In the steps 1 and 2, a state shown in FIG. 6A is acquired and at this time, the driving operation is in a neutral state in which the effector 53 does not activate the peeling starting point forming pin 51 and the blocks 52, 54 as shown in FIG. 7A. In such a state, it is checked whether or not leakage is caused from a flange 42t of the collet 42 by detecting an air flow rate and suction is continued until the leakage is in a normal range (a step 3).

Figure 6B:
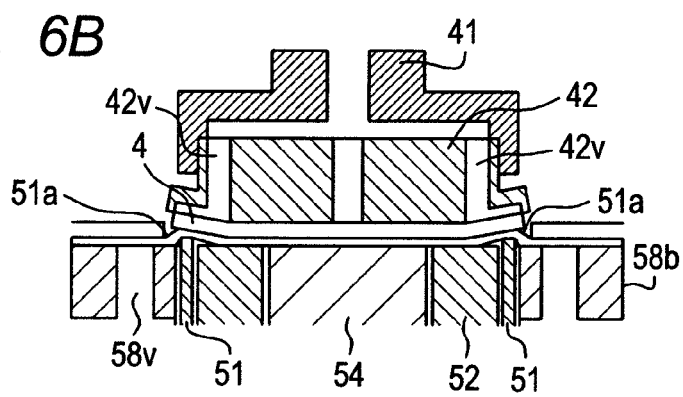
Figure 7B:
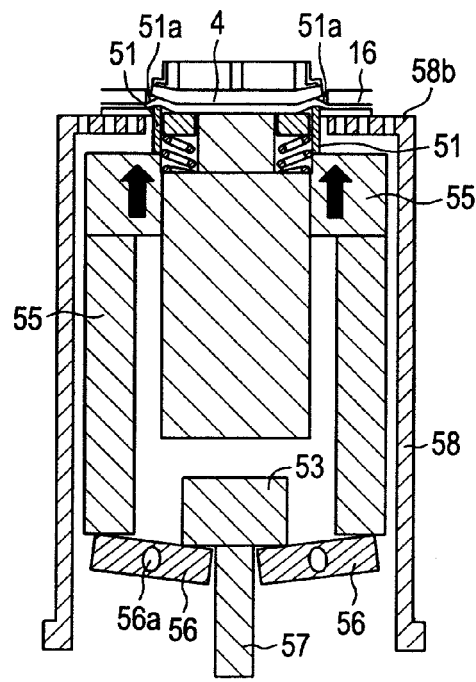

Next, only the peeling starting point forming pins 51 provided at the four corners of the outside block 52 are raised by a few tens to a few hundreds μm (a step 4). As a result, a thrust part in which the dicing tape 16 is raised in a circumference of the peeling starting point forming pin 51 is formed as shown in FIG. 6B and minute space, that is, a peeling starting point 51a is formed between the dicing tape 16 and the die attach film 18. Stress applied to the die 4 is greatly reduced because of this space and peeling operation in the next step can be securely executed. FIG. 7B shows the driving operation at this time. The effector 53 is lowered, the pin driving link 56 is rotated using the point 56a for a fulcrum, the pin raising/lowering link 55 is raised, and the peeling starting point forming pin 51 is thrust up.

Since the peeling starting point forming pin 51 has only to be able to form the minute space as described above, its diameter is 700 μm or less and its end may also be round or its end may also be flat.

In this thrust, the flange 42t of the collet 42 is slightly deformed as shown in FIG. 6B and prevents inflow of air. In this step, an air flow rate is detected as in the step 3 and suction is continued until leakage is in the normal range (a step 5).

Next, the effector 53 is raised and a position of the peeling starting point forming pin 51 is returned to an original position (a step 6). The peeling starting point forming pin 51 does not contribute to the peeling operation of the die 4 after the next step.

Figure 6C:
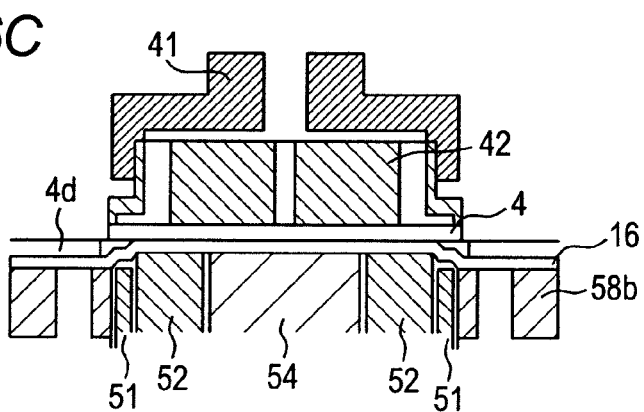
Figure 7C:
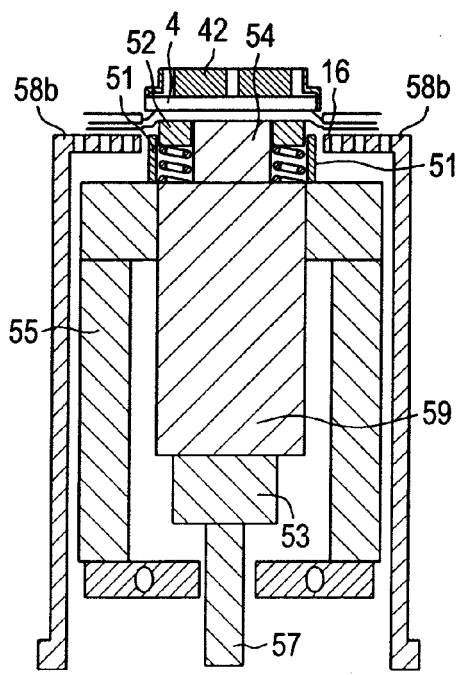

Next, the peeling operation of the die 4 is executed by the outside block 52 and the inside block 54. Therefore, as shown in FIG. 7C, the effector 53 is further raised and the peeling operation by the outside block 52 and the inside block 54 is executed (a step 7). The vicinity of the dome head 58a and a state of the collet attachment 40 at this time are shown in FIG. 6C. At this time, processing for detecting leakage from the flange of the collet is also executed as in the steps 3 and 5 (a step 8).

Figure 6D:
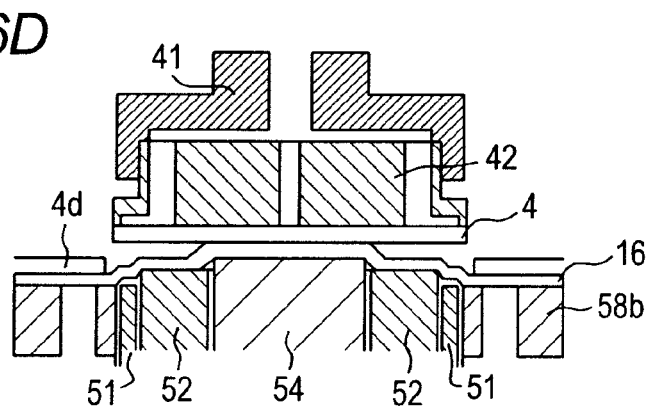
Figure 7D:
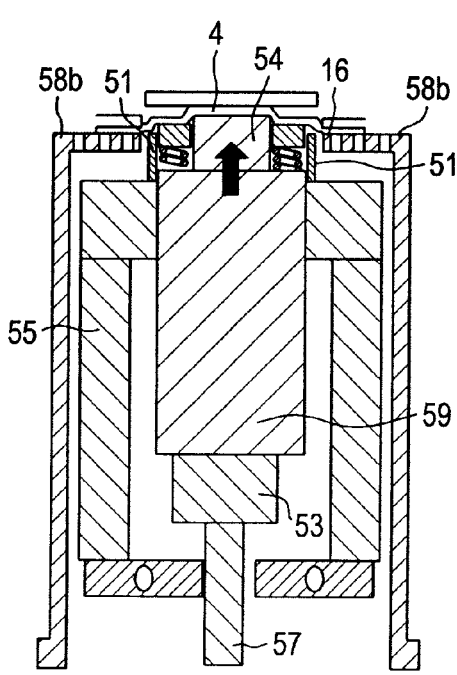

Next, when the effector 53 is further raised from a state shown in FIG. 7C as shown in FIG. 7D, only the inside block 54 is raised by the action of the half transfer spring 52b and a state shown in FIG. 6D is acquired (a step 9). In this state, touch area between the dicing tape 16 and the die 4 is equivalent to area which can be peeled by the rise of the collet and the die 4 is peeled by the rise of the collet 42.

As described above, according to the first embodiment related to the thrusting unit of the present invention, the peeling starting point forming pin 51 is provided to a position equivalent to the four corners of the die 4 and is raised at the beginning of the peeling process, the stress applied to the die 4 can be reduced by forming the space that functions as a starting point of peeling, and the following peeling process can be securely executed without breaking the die 4.

As a result, pickup errors can be reduced and the reliable die bonder or the pickup method can be provided.

FIGS. 8A to 8D show the configuration and a working condition of a thrusting unit 50 equivalent to a second embodiment of the present invention and correspond to FIGS. 7A to 7D in the first embodiment. In FIG. 8, the same reference numeral is allocated to the same structure as that in the first embodiment.

The second embodiment is different from the first embodiment in that in the first embodiment, the motion of the effector 53 is inverted by the inverting part to thrust the peeling starting point forming pin 51. In this embodiment, however, a part driven in the same direction as it is without inversion is provided.

The part driven in the same direction is provided with a timing control plate 71 coupled to a driving shaft 57 and a pin driving link 73 equipped with a compression spring 72 between the timing control plate 71 and the pin driving link. The pin driving link is provided with a holding plate 74 to hold a neutral state shown in FIG. 8A in which a peeling starting pin forming pin 51 is not thrust up by the timing control plate 71.

Figure 8A:
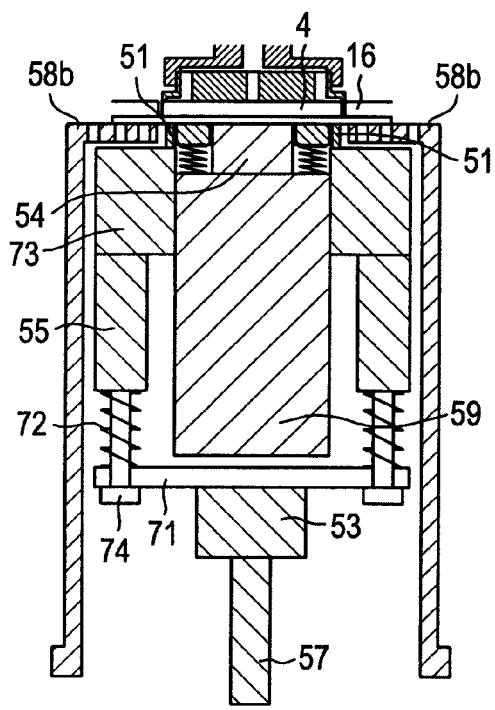
FIGS. 8A to 8D show the configuration and a working condition of a thrusting unit equivalent to a second embodiment of the present invention.
Figure 8B:
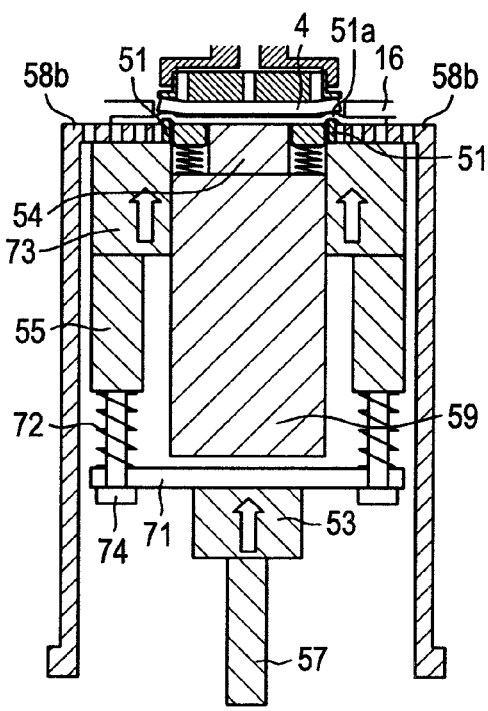
Figure 8C:
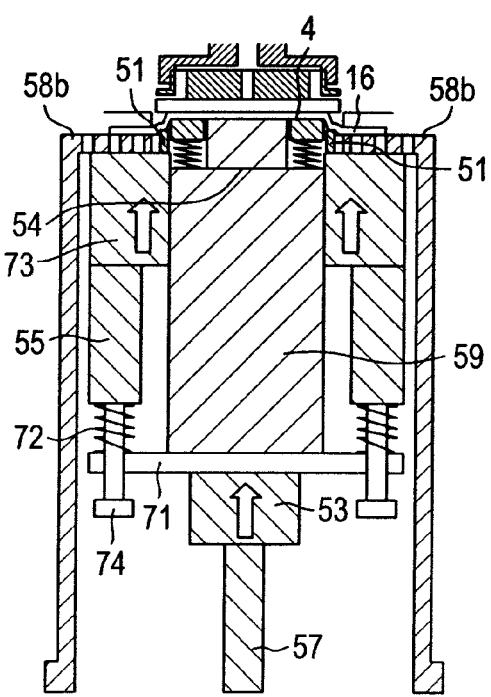
Figure 8D:
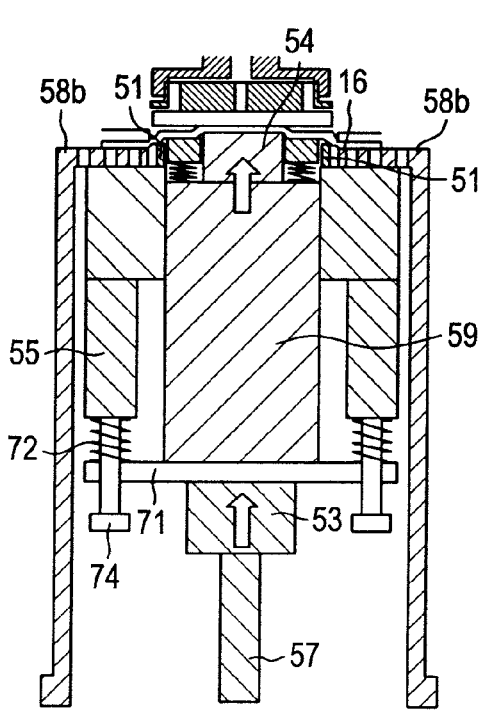
Figure 9:
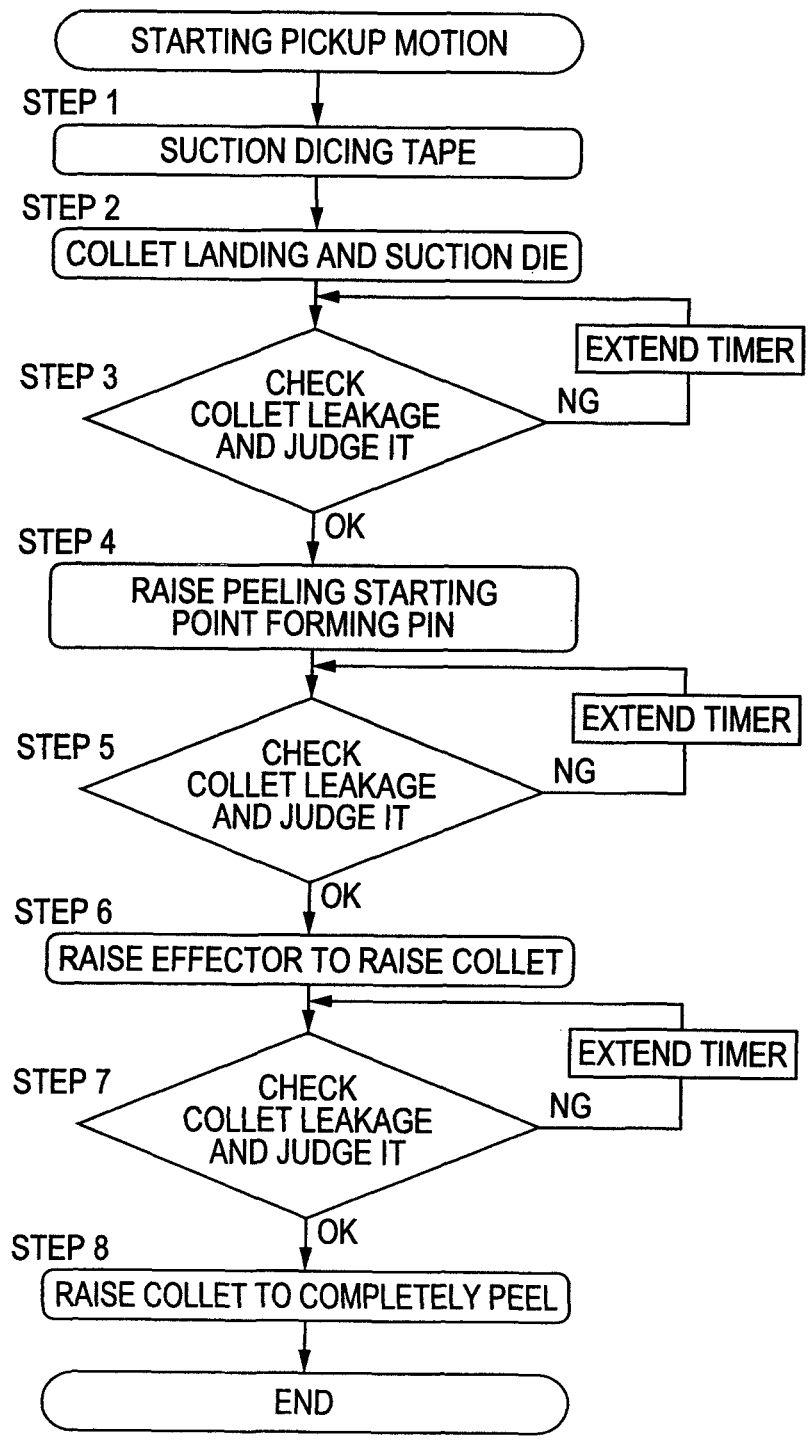
FIG. 9 shows a processing flow of pickup operation in the second embodiment.
Figure 10A:
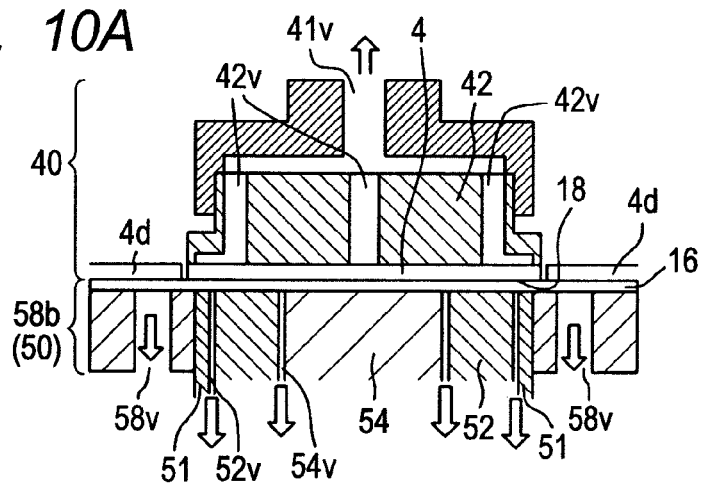
FIGS. 10A to 10D show the operation of the vicinity of a dome head and a collet attachment in the processing flow shown in FIG. 9.
Figure 10B:
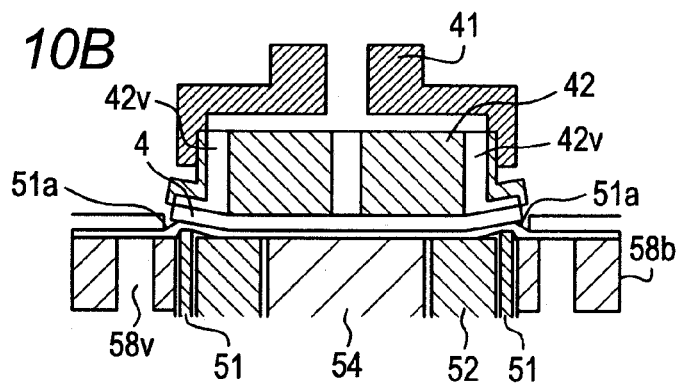
Figure 10C:
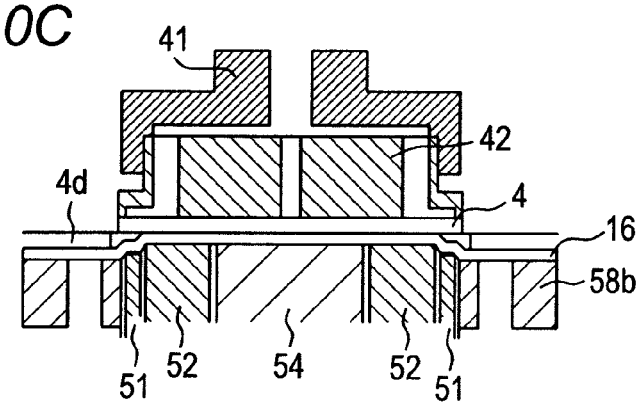
Figure 10D:
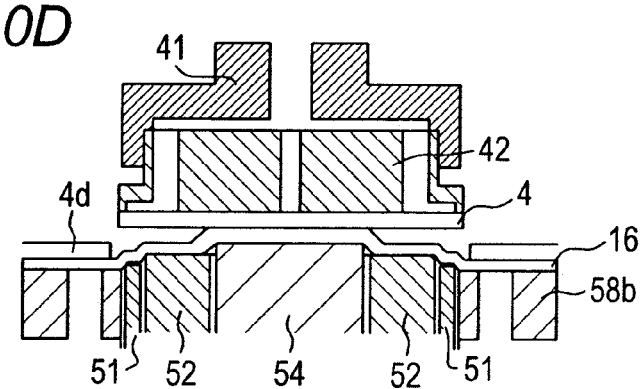

Next, the working condition of the thrusting unit 50 in the second embodiment will be described referring to FIGS. 8A to 10D. FIG. 9 shows a processing flow of pickup operation in the second embodiment and FIGS. 10A to 10D show the vicinity of a dome head 58b and the operation of a collet attachment 40 in the processing flow shown in FIG. 9. FIGS. 9 to 10D correspond to FIGS. 5 to 6D in the first embodiment.

The processing flow of the pickup operation shown in FIG. 9 is different from the first embodiment in that FIG. 9 does not have a step equivalent to the step 6 in the processing flow of the pickup operation shown in FIG. 5 in the first embodiment. Operation for realizing the operation will be described below. In the second embodiment, as shown in FIG. 8B, when an effector 73 is raised, the peeling starting point forming pin 51 thrusts a dicing tape 16 until the pin driving link 73 is touched to the dome head 58b. Afterward, when the effector 53 is raised, peeling operation by an outside block 52 and an inside block 54 is first executed (refer to a step 6 in FIG. 9, FIG. 8C and FIG. 10C), next, only the inside block 54 is raised by the action of a half transfer spring 52b, and a state shown in FIG. 8D is acquired (refer to a step 8 in FIG. 9 and FIG. 10D).

As shown in FIGS. 8C, 8D, 10C and 10D, since the peeling starting point forming pin 51 cannot be raised due to the dome head 58b, a state shown in FIG. 8B is maintained. Accordingly, the peeling starting point forming pin 51 does not contribute to the peeling operation shown in FIGS. 8C and 8D.

As described above, in the thrusting unit 50 equivalent to the second embodiment of the present invention, the peeling starting point forming pin 51 is also provided to a position equivalent to four corners of a die 4, the peeling starting point forming pin 51 is raised at the beginning of the peeling process, stress applied to the die 4 can be reduced by forming space which functions as a starting point of peeling, and the following peeling process can be securely executed without breaking the die 4.

As a result, in the second embodiment of the present invention, a pickup error can also be reduced and a reliable die bonder or a pickup method can be provided.

FIG. 11 show an example in which a collet without a flange 42t is applied to the thrusting unit 50 equivalent to the second embodiment of the present invention and show steps corresponding to FIGS. 10A to 10D.

Figure 11A:
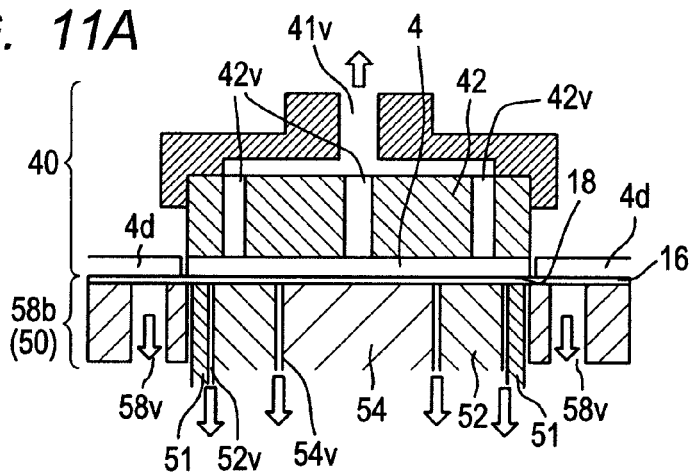
FIGS. 11A to 11D show an example in which a collet without a flange is applied to the thrusting unit equivalent to the second embodiment of the present invention.
Figure 11B:
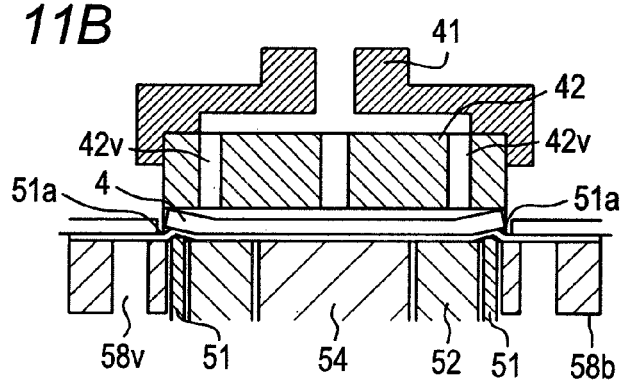

As clear from FIGS. 11A to 11D, though leakage from the collet may slightly increase in the step shown in FIG. 11B for raising the peeling starting point forming pin 51, processing could be executed without a problem in an actual process. As described above, this embodiment can be applied independent of a shape of the collet.

Figure 11C:
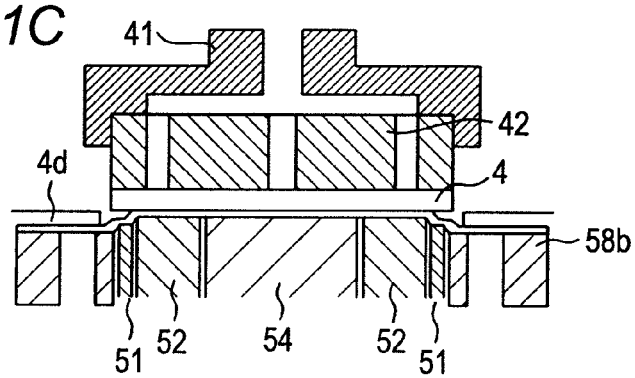
Figure 11D:
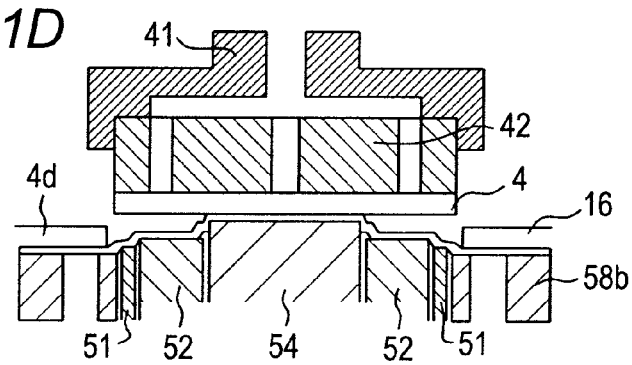
Figure 12:
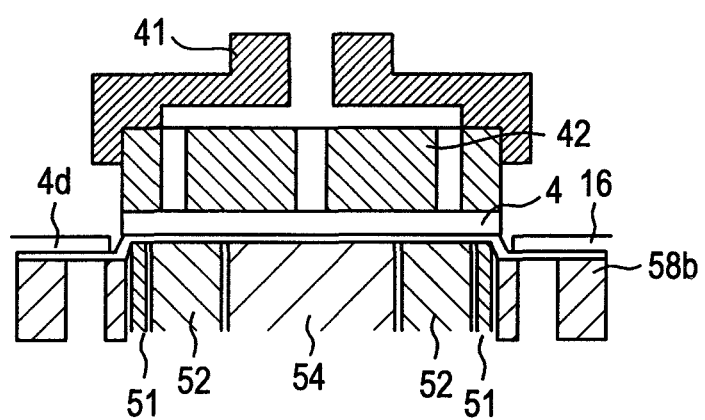
FIG. 12 shows a state between FIG. 10B and FIG. 10C and shows a state when a peeling starting point forming pin, an outside block and an inside block are at the same level.

FIG. 12 shows a state between FIG. 11B and FIG. 11C and shows a state when the peeling starting point forming pin 51, the outside block 52 and the inside block 54 are at the same level. In an operational flow shown in FIGS. 11A to 11D, till a state shown in FIG. 11B, the collet 42 is not made to land and in the state shown in FIG. 12, the collet is landed. As a result, fear of slight leakage from the collet in the embodiment shown in FIGS. 11A to 11D is eliminated. As a result, even if the collet without a flange 42t is applied, the peeling process can be more securely executed.

As a result, a pickup error can be reduced and a reliable die bonder or a pickup method can be provided.

As described above, according to the first and second embodiments related to the thrusting units of the present invention, two operations independently driven can be driven by one driving source and the small-sized or low-priced thrusting unit can be provided.

Figure 13A:
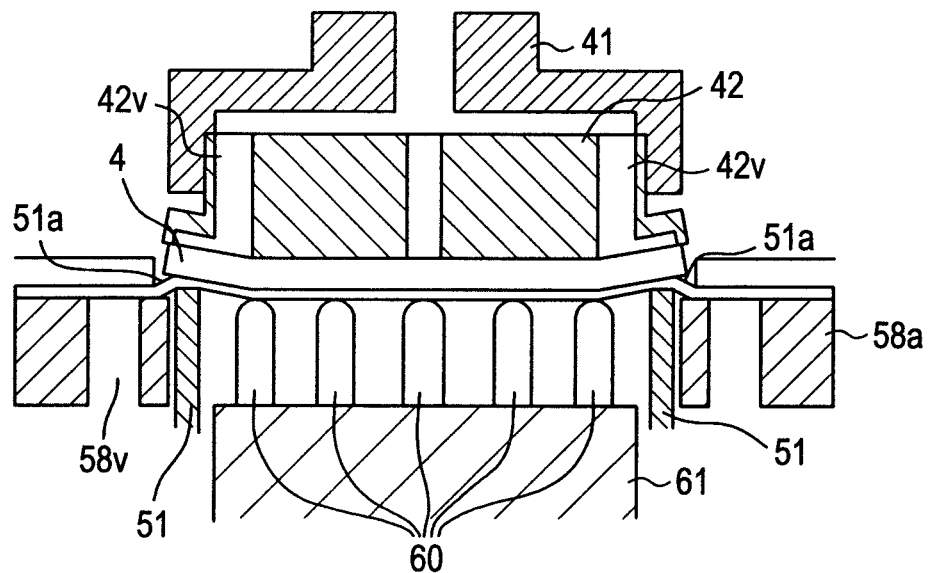
FIGS. 13A and 13B show an embodiment of a second thrusting unit according to the present invention.
Figure 13B:
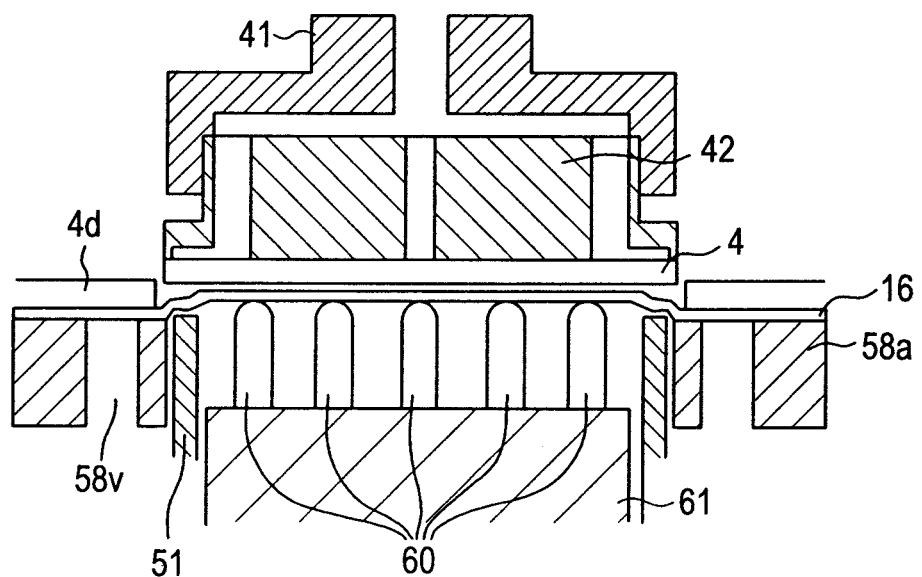

FIGS. 13A and 13B show a third embodiment related to a third thrusting unit of the present invention. The third embodiment is different from the first embodiment in that a thrusting pin is used for a thrusting part in place of the block. FIG. 13A corresponds to FIG. 10B and FIG. 13B corresponds to FIG. 10D.

In this embodiment, peeling work is also more securely executed by forming a peeling starting point 51a by a peeling starting point forming pin 51 beforehand as shown in FIG. 13A and afterward, by thrusting up a thrusting pin base 61 to which plural thrusting pins 60 are fixed at a stroke as shown in FIG. 13B. In FIG. 13B, the peeling starting point forming pin is returned to an original position and does not take part in thrusting shown in FIG. 13B.

Accordingly, in the third embodiment related to the thrusting unit of the present invention, stress applied to a die 4 can also be reduced by forming space to be a starting point of peeling and the following peeling process can be more securely executed without breaking the die 4.

In the above-mentioned first to third embodiments related to the thrusting units, the peeling starting point forming pins 51 provided at the four corners of the die 4 are simultaneously thrust up. FIGS. 14A to 14E show another embodiment related to the number of peeling starting point forming pins or a driving method.

Figure 14A:
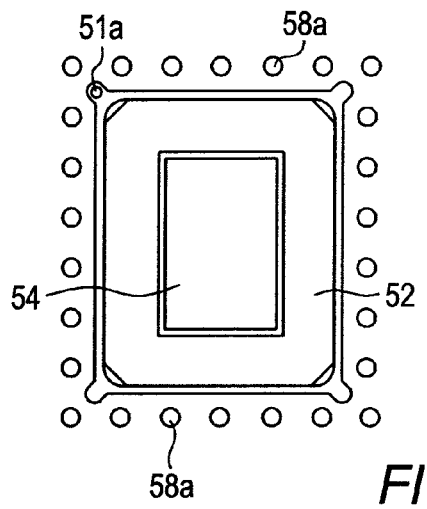
FIGS. 14A to 14E show another embodiment related to the number of peeling starting point forming pins or a driving method.
Figure 14B:
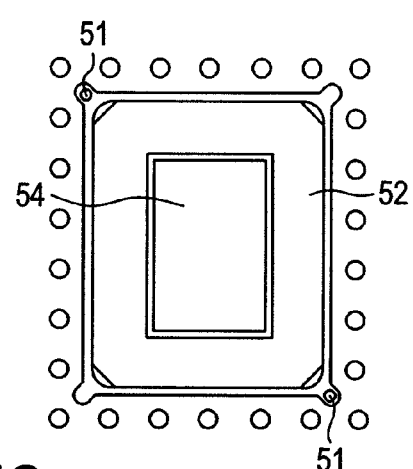

In FIGS. 14A and 14B, the peeling starting point forming pins 51 are not provided at all four corners, FIG. 14A shows an example that the peeling starting point forming pin is at one of the four corners and FIG. 14B shows an example that the two peeling starting point forming pins 51 are provided at opposite corners of the die 4. In both cases, the die 4 can be more securely peeled from a dicing tape 16 by forming at least one starting point of peeling, compared with the related art.

Figure 14C:
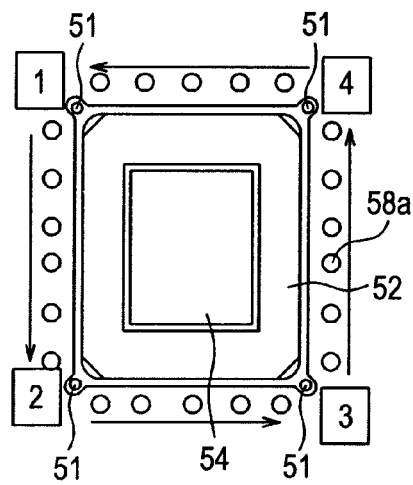
Figure 14D:
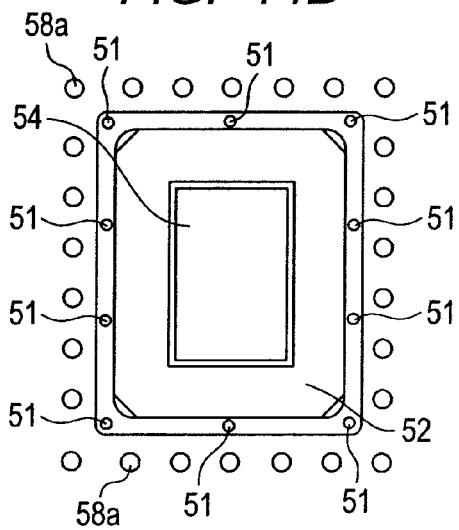

FIG. 14C shows an example that the peeling starting point forming pins are not thrust up simultaneously at the four corners but the peeling starting point forming pins 51 at the four corners are sequentially thrust up. In this example, stress applied to the die can be reduced to some extent by sequentially thrusting up them. FIG. 14D shows an example that the peeling starting point forming pins 51 are provided in not only the four corners but circumferences of the die. In this example, many starting points of peeling are provided, reducing stress applied to the die 4 and the die 4 can be prevented from being deformed or broken.

Figure 15:
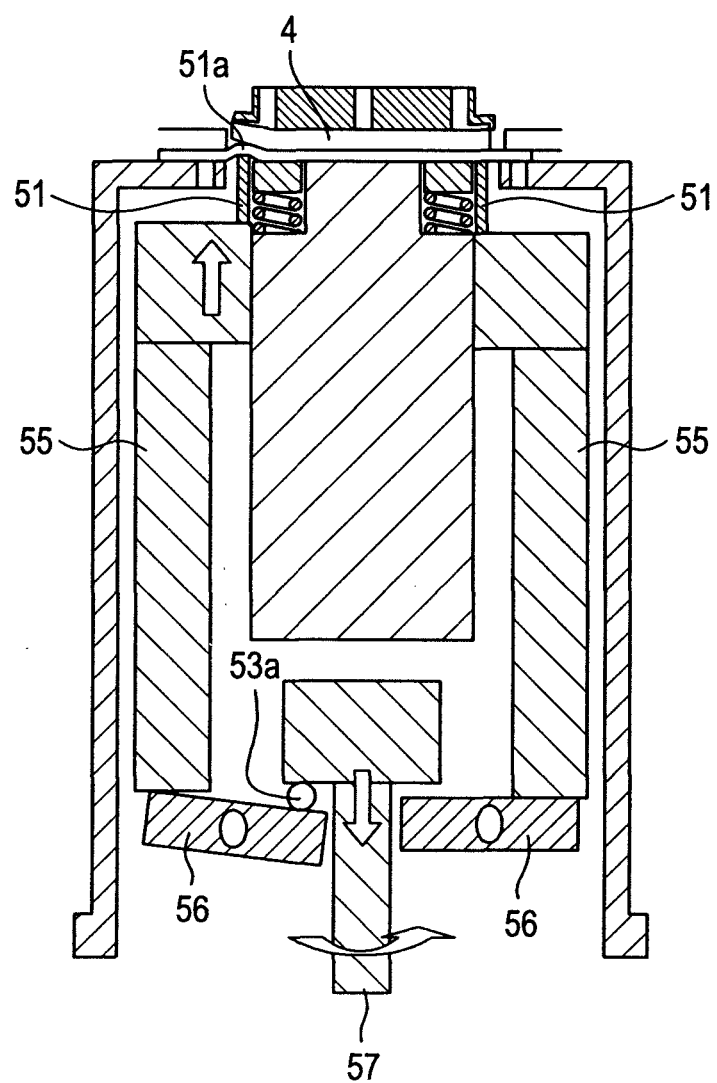
FIG. 15 shows an example of a method of driving the peeling starting point forming pin applied to FIGS. 10C and 10D.

FIG. 15 shows an example of a method of driving the peeling starting point forming pins 51 applied in FIGS. 14C and 14D. The basic configuration is similar to that shown in FIGS. 4A and 4B in the first embodiment. The basic configuration is different from that shown in FIGS. 4A and 4B in that an effector 53 is rotated and a spherical projection 53a is provided at one location of a bottom of the effector 53. In FIG. 15, pin raising/lowering links 55 and pin driving links 56 respectively of the same number as the number of the peeling starting point forming pins 51 are also provided. When the effector 53 is lowered and rotated, the projection 53a successively rotates the pin driving links 56, the pin driving link raises the corresponding pin raising/lowering link 55, and the pin raising/lowering link thrusts up the corresponding peeling starting point forming pin 51. As a result, even if the peeling starting point forming pin 51 is arranged at the only corners or even if it is also arranged in the circumferences in addition to the corners, the peeling starting point forming pin 51 is sequentially thrust up and the peeling starting point 51a can be successively formed.

Figure 14E:
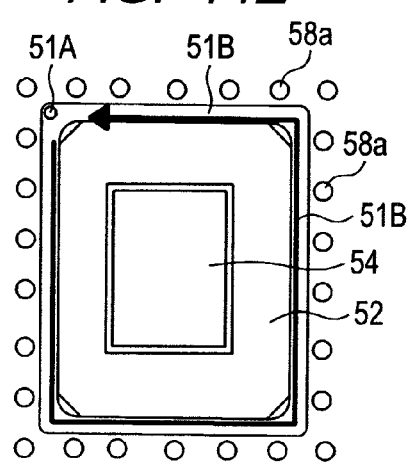

Next, FIG. 14E will be described. FIG. 14E shows a method of successively forming the peeling starting point by moving the peeling starting point forming pin or others to the circumference of the die 4. For example, in the method, a rail 51B configured by a concave linear motor is provided to a circumference of an outside block 52, a magnet 51A in the shape of a sphere or in the shape of a round roller is moved in place of the pin, and the peeling starting point 51a is successively formed. According to the method shown in FIG. 14E, the similar effect to that shown in FIG. 14D can also be produced. According to an embodiment shown in FIG. 14E, peeling starting point forming means that has been described as the peeling starting point forming pin may also be in the shape of a sphere in addition to the pin.

In the above-mentioned embodiments, die bonding in which the peeled die is bonded on the board has been described. If the die is set on a carrying tray in place of bonding the die on the board, the present invention can also be applicable to the die sorter.

The embodiments of the present invention have been described. The present invention include various alternative examples, modification or transformation respectively described above in a range in which they do not deviate from the spirit of the present invention.

What is claimed is:

1. A die bonder, comprising:
   a thrusting unit provided with a peeling starting point forming section that thrusts up a dicing film in a predetermined part in a circumference of a die and forms a peeling starting point, a peeling section that thrusts up the dicing film in a part different from the predetermined part and peels the die from the dicing film, wherein the peeling starting point forming section is provided with at least one pin that forms the peeling starting point, and a driving section that separately drives a thrust by the peeling starting point forming section and a thrust by the peeling section, wherein the driving section is provided with an effector vertically driven by a single driving source; when the effector is raised, one of the two thrusts is executed; and when the effector is lowered, the other thrust is executed via an inverting part that converts the lowering of the effector to an upward movement of the peeling starting point forming section or the peeling section;
   a collet that suctions the die; and
   a bonding head that peels the die suctioned by the collet and thrust up from the dicing film and mounts it on a board.

2. The die bonder according to claim 1,
wherein the other thrust is the thrust by the peeling starting point forming section;
the driving section is provided with a driving source that rotates the effector; and
the effector sequentially drives the inverting part.

3. A die bonder, comprising:
a thrusting unit provided with a peeling starting point forming section that thrusts up a dicing film in a predetermined part in a circumference of a die and forms a peeling starting point, a peeling section that thrusts up the dicing film in a part different from the predetermined part and peels the die from the dicing film and a driving section that separately drives a thrust by the peeling starting point forming section and a thrust by the peeling section, wherein the driving section is provided with an effector vertically driven by a single driving source; when the effector is raised, one of the two thrusts is executed; and when the effector is lowered, the other thrust is executed via an inverting part that converts the lowering of the effector to an upward movement of the peeling starting point forming section or the peeling section;
a collet that suctions the die; and
a bonding head that peels the die suctioned by the collet and thrust up from the dicing film and mounts it on a board.

4. The die bonder according to claim 3,
wherein the other is the thrust by the peeling starting point forming section;
the driving section is provided with a driving source that rotates the effector; and
the effector sequentially drives the inverting part.

5. A die bonder, comprising:
a thrusting unit provided with a peeling starting point forming section that thrusts up a dicing film in a predetermined part in a circumference of a die and forms a peeling starting point, wherein the predetermined part is provided in at least one of four corners of the die, a peeling section that thrusts up the dicing film in a part different from the predetermined part and peels the die from the dicing film and a driving section that separately drives a thrust by the peeling starting point forming section and a thrust by the peeling section, wherein the driving section is provided with an effector vertically driven by a single driving source; when the effector is raised, one of the two thrusts is executed; and when the effector is lowered, the other thrust is executed via an inverting part that converts the lowering of the effector to an upward movement of the peeling starting point forming section or the peeling section;
a collet that suctions the die; and
a bonding head that peels the die suctioned by the collet and thrust up from the dicing film and mounts it on a board.

6. The die bonder according to claim 5,
wherein the other thrust is the thrust by the peeling starting point forming section;
the driving section is provided with a driving source that rotates the effector; and
the effector sequentially drives the inverting part.

7. A pickup device, comprising:
an expansion ring that holds a wafer ring;
a holding section that holds a dicing film which is held by the wafer ring and to which a plurality of dies are applied; and
a thrusting unit provided with a peeling starting point forming section that thrusts up the dicing film in a predetermined part in a circumference of the die and forms a peeling starting point, a peeling section that thrusts up the dicing film in a part different from the predetermined part and peels the die from the dicing film and a driving section that separately drives a thrust by the peeling starting point forming section and a thrust by the peeling section, wherein the driving section is provided with an effector vertically driven by a single driving source; when the effector is raised, one of the two thrusts is executed; and when the effector is lowered, the other thrust is executed via an inverting part that converts the lowering of the effector to an upward movement.

8. The pickup device according to claim 7, wherein the other thrust is the thrust by the peeling starting point forming section.

9. A pickup device, comprising:
an expansion ring that holds a wafer ring;
a holding section that holds a dicing film which is held by the wafer ring and to which a plurality of dies are applied; and
a thrusting unit provided with a peeling starting point forming section that thrusts up the dicing film in a predetermined part in a circumference of the die and forms a peeling starting point, a peeling section that thrusts up the dicing film in a part different from the predetermined part and peels the die from the dicing film, wherein a peeling starting point forming section is provided with at least one pin that forms the peeling starting point, and a driving section that separately drives a thrust by the peeling starting point forming section and a thrust by the peeling section, wherein the driving section is provided with an effector vertically driven by a single driving source; when the effector is raised, one of two thrusts is executed; and when the effector is lowered, the other thrust is executed via an inverting part that converts the lowering of the effector to an upward movement.

10. The pickup device according to claim 9, wherein the other thrust is the thrust by the peeling starting point forming section.

* * * * *